United States Patent
Holenarsipur et al.

(10) Patent No.: US 8,803,270 B2
(45) Date of Patent: Aug. 12, 2014

(54) LIGHT SENSOR HAVING IR CUT AND COLOR PASS INTERFERENCE FILTER INTEGRATED ON-CHIP

(71) Applicant: Maxim Integrated Products, Inc., San Jose, CA (US)

(72) Inventors: Prashanth Holenarsipur, Fremont, CA (US); Zhihai Wang, Sunnyvale, CA (US); Nicole D. Kerness, Menlo Park, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 14/044,299

(22) Filed: Oct. 2, 2013

(65) Prior Publication Data

US 2014/0027876 A1 Jan. 30, 2014

Related U.S. Application Data

(63) Continuation of application No. 13/187,729, filed on Jul. 21, 2011, now Pat. No. 8,624,341.

(60) Provisional application No. 61/436,510, filed on Jan. 26, 2011.

(51) Int. Cl.
*H01L 31/0216* (2014.01)

(52) U.S. Cl.
USPC ............... 257/432; 438/68; 438/70; 257/435

(58) Field of Classification Search
USPC .................. 257/432, 435, E31.123, E31.122; 438/68, 70, FOR. 136
See application file for complete search history.

(56) References Cited

U.S. PATENT DOCUMENTS

| 7,229,671 | B2 | 6/2007 | Keh et al. |
| 8,274,051 | B1 | 9/2012 | Aswell |
| 8,395,686 | B2 | 3/2013 | Tatani et al. |
| 2006/0024505 | A1 | 2/2006 | Keh et al. |
| 2006/0049412 | A1 | 3/2006 | Cho |
| 2008/0105939 | A1 | 5/2008 | Keh et al. |
| 2010/0187557 | A1 | 7/2010 | Samoilov |
| 2011/0024858 | A1 | 2/2011 | Yoshihara |

(Continued)

FOREIGN PATENT DOCUMENTS

| JP | 200860320 | 3/2008 |
| WO | 2008081950 | 10/2008 |

OTHER PUBLICATIONS

Pending U.S. Appl. No. 13/337,871, filed Dec. 27, 2011 entitled "Light Sensor Having Transparent Substrate and Diffuser Formed Therein".

*Primary Examiner* — George Fourson, III
(74) *Attorney, Agent, or Firm* — Advent, LLP

(57) ABSTRACT

A light sensor is described that includes an IR interference filter and at least one color interference filter integrated on-chip. The light sensor comprises a semiconductor device (e.g., a die) that includes a substrate. Photodetectors are disposed proximate to the surface of the substrate. An IR interference filter is disposed over the photodetectors. The IR interference filter is configured to filter infrared light from light received by the light sensor to at least substantially block infrared light from reaching the photodetectors. At least one color interference filter is disposed proximate to the IR interference filter. The color interference filter is configured to filter visible light received by the light sensor to pass light in a limited spectrum of wavelengths (e.g., light having wavelengths between a first wavelength and a second wavelength) to at least one of the photo detectors.

17 Claims, 11 Drawing Sheets

(56) References Cited

U.S. PATENT DOCUMENTS

| | | |
|---|---|---|
| 2011/0032398 A1 | 2/2011 | Lenchenkov |
| 2011/0122303 A1 | 5/2011 | Bonkohara |
| 2012/0170284 A1 | 7/2012 | Shedletsky |
| 2012/0187280 A1 | 7/2012 | Kerness et al. |
| 2012/0187281 A1 | 7/2012 | Kerness et al. |
| 2012/0187512 A1 | 7/2012 | Wang et al. |
| 2012/0187515 A1 | 7/2012 | Kerness et al. |
| 2012/0312990 A1 | 12/2012 | Aswell |

LIGHT SENSOR HAVING IR CUT AND COLOR PASS INTERFERENCE FILTER INTEGRATED ON-CHIP

CROSS-REFERENCE TO RELATED APPLICATIONS

The present application is a continuation under 35 U.S.C. §120 of U.S. patent application Ser. No. 13/187,729, filed Jul. 21, 2011, entitled "LIGHT SENSOR HAVING IR CUT AND COLOR PASS INTERFERENCE FILTER INTEGRATED ON-CHIP;" which claims priority under 35 U.S.C. §119(e) of U.S. Provisional Application Ser. No. 61/436,510 filed Jan. 26, 2011, entitled "LIGHT SENSOR HAVING IR CUT AND COLOR INTERFERENCE FILTER INTEGRATED ON-CHIP." U.S. patent application Ser. No. 13/187,729 and U.S. Provisional Application Ser. No. 61/436,510 are hereby incorporated by reference in their entireties.

BACKGROUND

Electronic devices, such as smart phones, tablet computers, digital media players, and so forth, increasingly employ light sensors to control the manipulation of a variety of functions provided by the device. For example, light sensors may be used by an electronic device to detect ambient lighting conditions in order to control the brightness of the device's display screen. Typical light sensors employ photodetectors such as photodiodes, phototransistors, or the like, which convert received light into an electrical signal (e.g., a current or voltage). However, the response of such photodetectors can be influenced by the presence of infrared (IR) light (i.e., electromagnetic radiation having a wavelength greater than approximately 700 nanometers (nm) that can be detected by the photodetector). For example, a light sensor of an electronic device may indicate that the surrounding ambient environment is "brighter" than it really is because the surrounding lighted environment contains a larger proportion of infrared light than normal, such as where the surrounding lighted environment is furnished by artificial lighting, and so forth.

SUMMARY

A light sensor is described that includes an IR interference filter and at least one color interference filter integrated on-chip (i.e., integrated on the die of the light sensor). In one or more implementations, the light sensor comprises a semiconductor device (e.g., a die) that includes a substrate. Photodetectors (e.g., photodiodes, phototransistors, etc.) are disposed proximate to the surface of the substrate. An IR interference filter is disposed over the photodetectors. The IR interference filter is configured to filter infrared light from light received by the light sensor to at least substantially block infrared light from reaching the photodetectors. At least one color interference filter is disposed above or below the IR interference filter. The color interference filter is configured to filter visible light received by the light sensor to pass light in a limited spectrum of wavelengths (e.g., light having wavelengths between a first wavelength and a second wavelength) to at least one of the photodetectors. The photodetectors may also comprise one or more clear photodetectors configured to receive light that is not filtered by a color interference filter, thereby allowing the clear photodetector to detect the ambient light environment.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

Figure 1A:
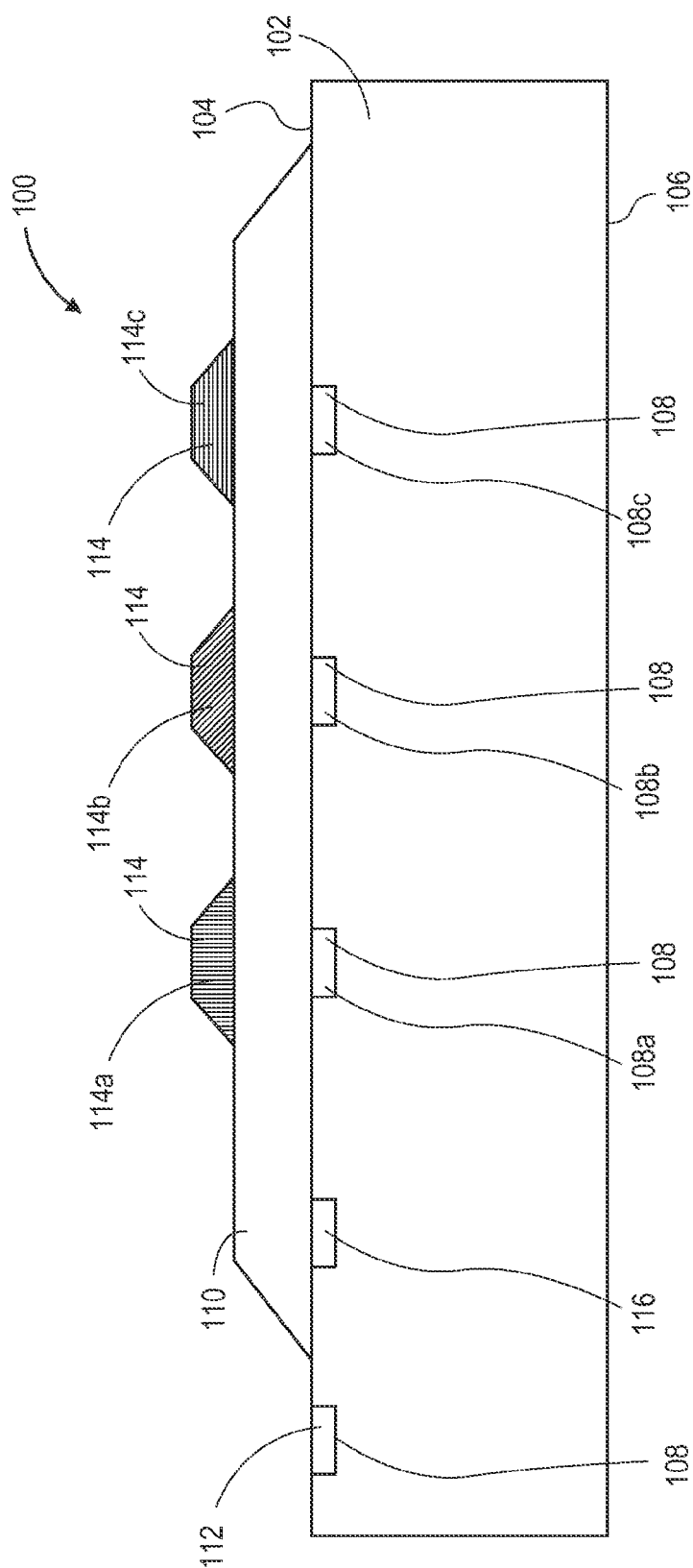
FIG. 1A is a diagrammatic partial cross-sectional side view illustrating a light sensor comprised of a semiconductor device having a plurality of photodetectors, an IR cut interference filter, a plurality of color interference filters, and a clear photodetector in accordance with an example implementation of the present disclosure.
Figure 1B:
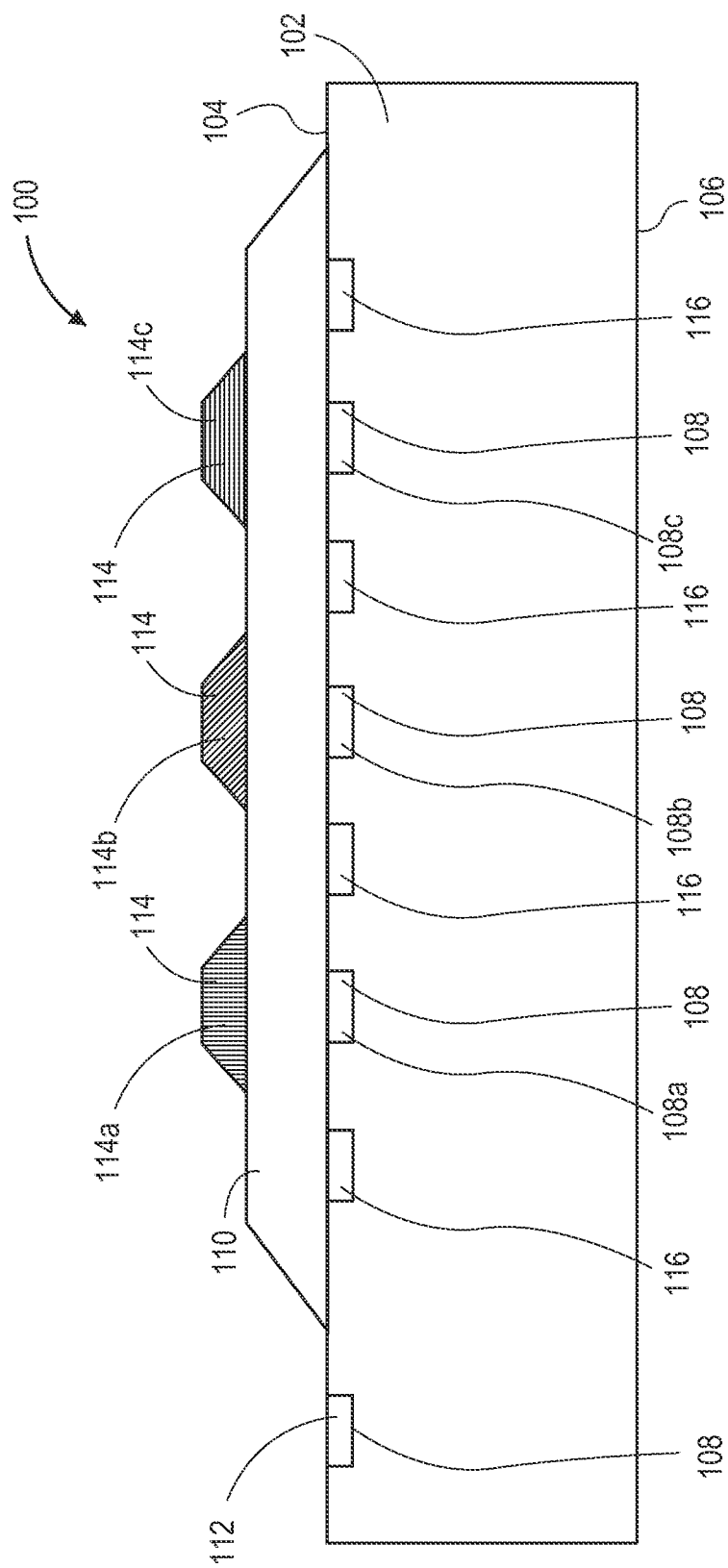
FIG. 1B is a diagrammatic partial cross-sectional side view illustrating a light sensor comprised of a semiconductor device having a plurality of photodetectors, an IR cut interference filter, and a plurality of color interference filters, wherein clear photodetectors are positioned between the color interference filters to form clear sensors.
Figure 1C:
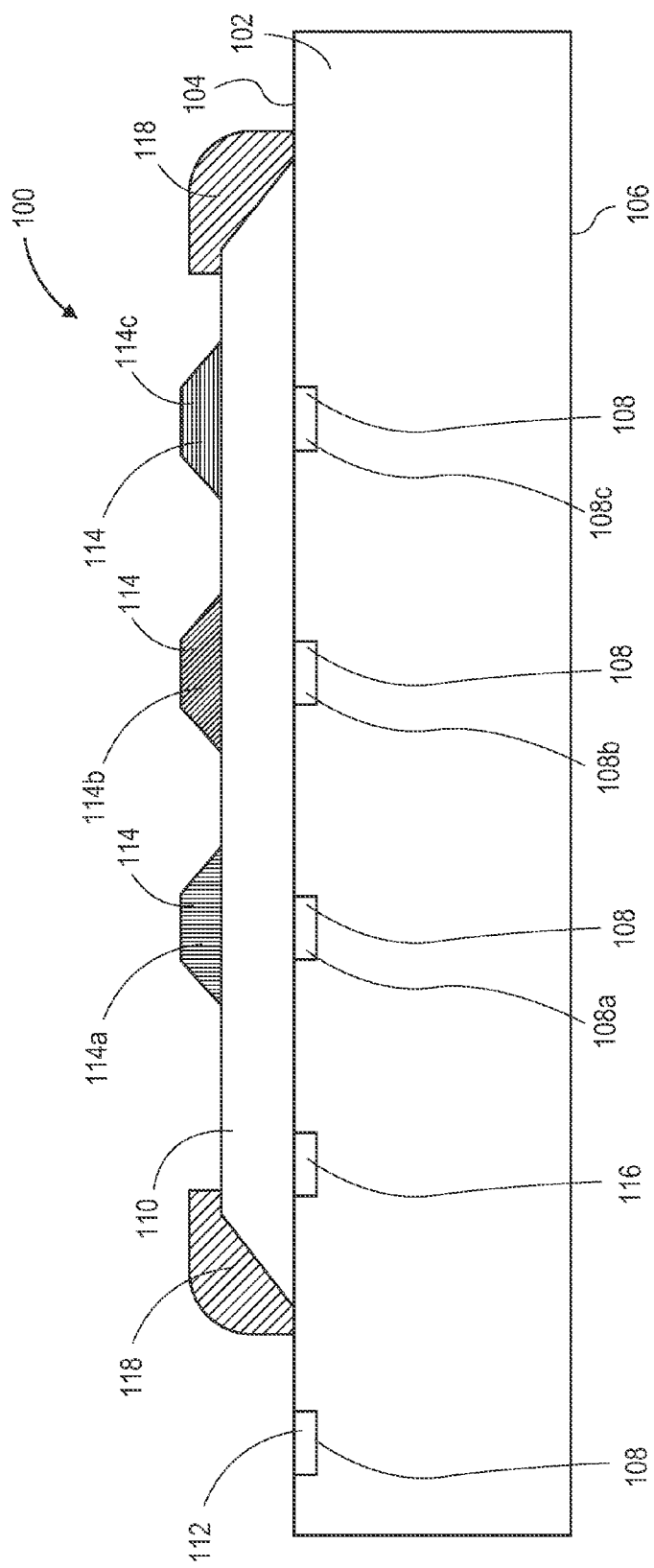

FIG. 1C is a diagrammatic partial cross-sectional side view illustrating the light sensor comprised of a semiconductor device having a plurality of photodetectors, an IR cut interference filter, a plurality of color interference filters, and a dark mirror covering the periphery of the IR cut interference filter and/or other light transmitting edges in accordance with an example implementation of the present disclosure.

Figure 1D:
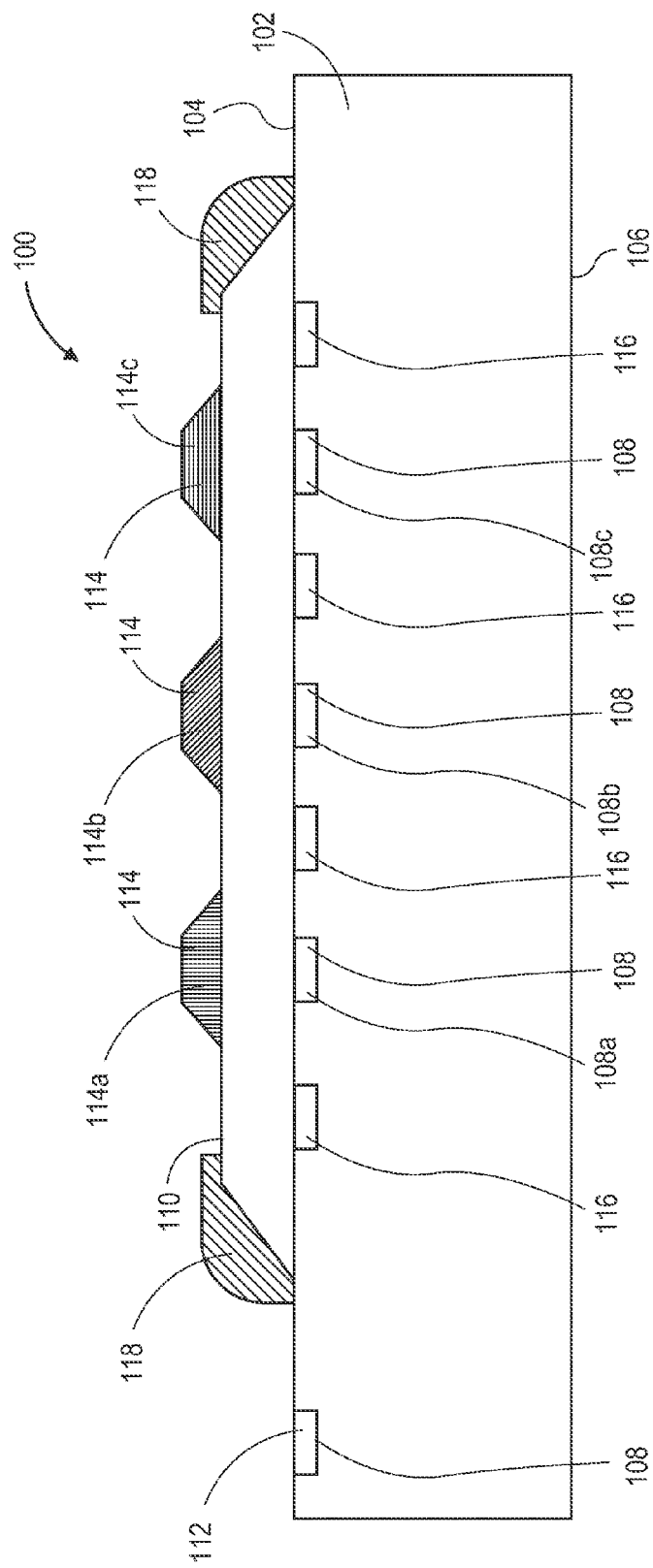

FIG. 1D is a diagrammatic partial cross-sectional side view illustrating the light sensor comprised of a semiconductor device having a plurality of photodetectors, an IR cut interference filter, a plurality of color interference filters, and a dark mirror in accordance with an example implementation of the present disclosure.

Figure 1E:
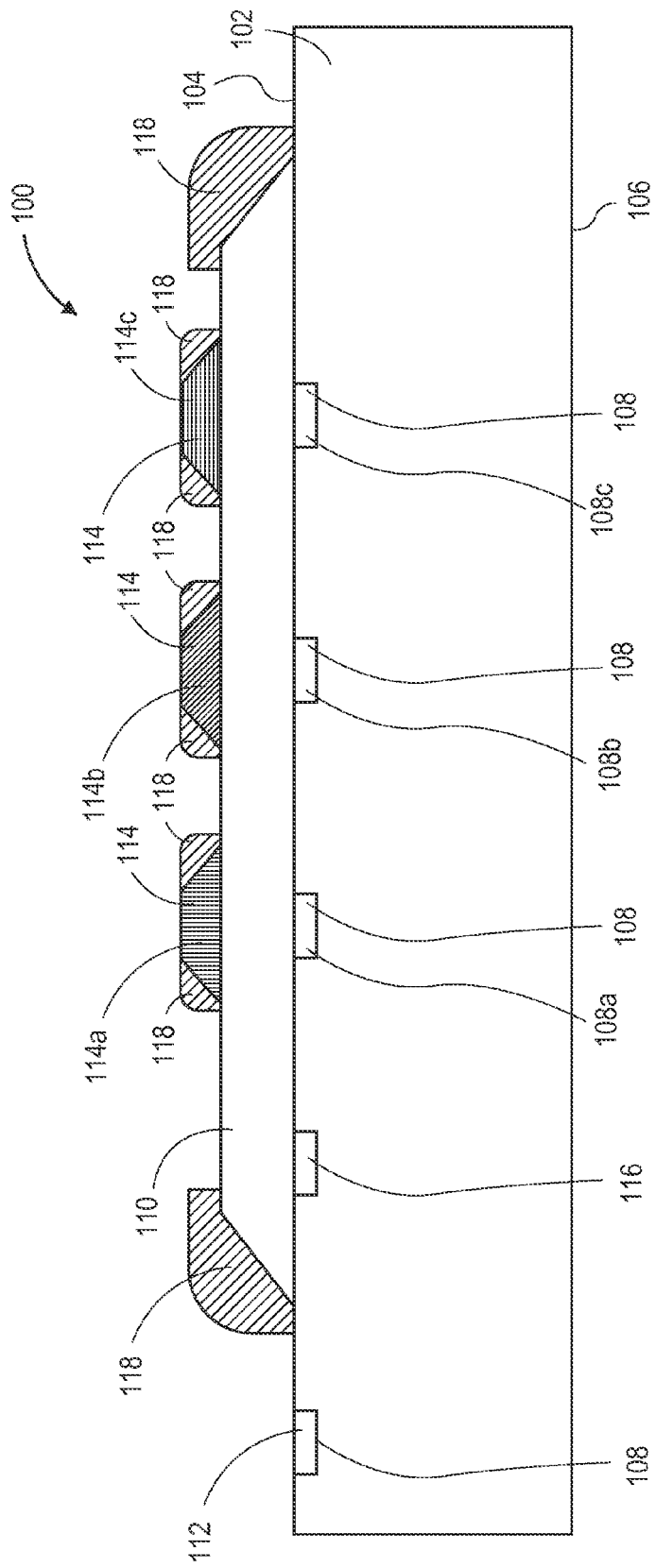

FIG. 1E is a diagrammatic partial cross-sectional side view illustrating the light sensor comprised of a semiconductor device having a plurality of photodetectors, an IR cut interference filter, a plurality of color interference filters, and a dark mirror covering the periphery of the IR cut interference filter and/or other light transmitting edges (e.g., color interference filters) color in accordance with an example implementation of the present disclosure.

Figure 1F:
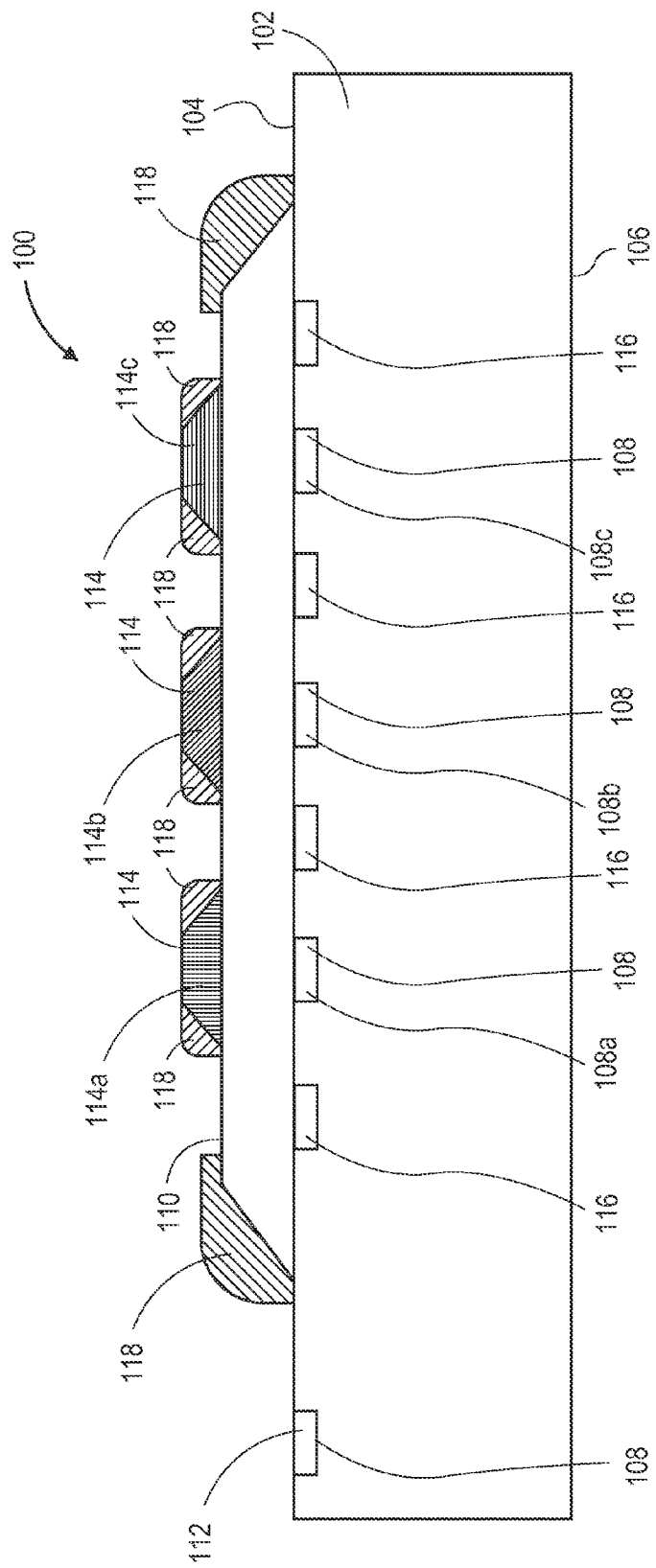

FIG. 1F is a diagrammatic partial cross-sectional side view illustrating the light sensor comprised of a semiconductor device having a plurality of photodetectors, an IR cut interference filter, a plurality of color interference filters, and a dark mirror (e.g., color interference filters) in accordance with an example implementation of the present disclosure.

Figure 2A:
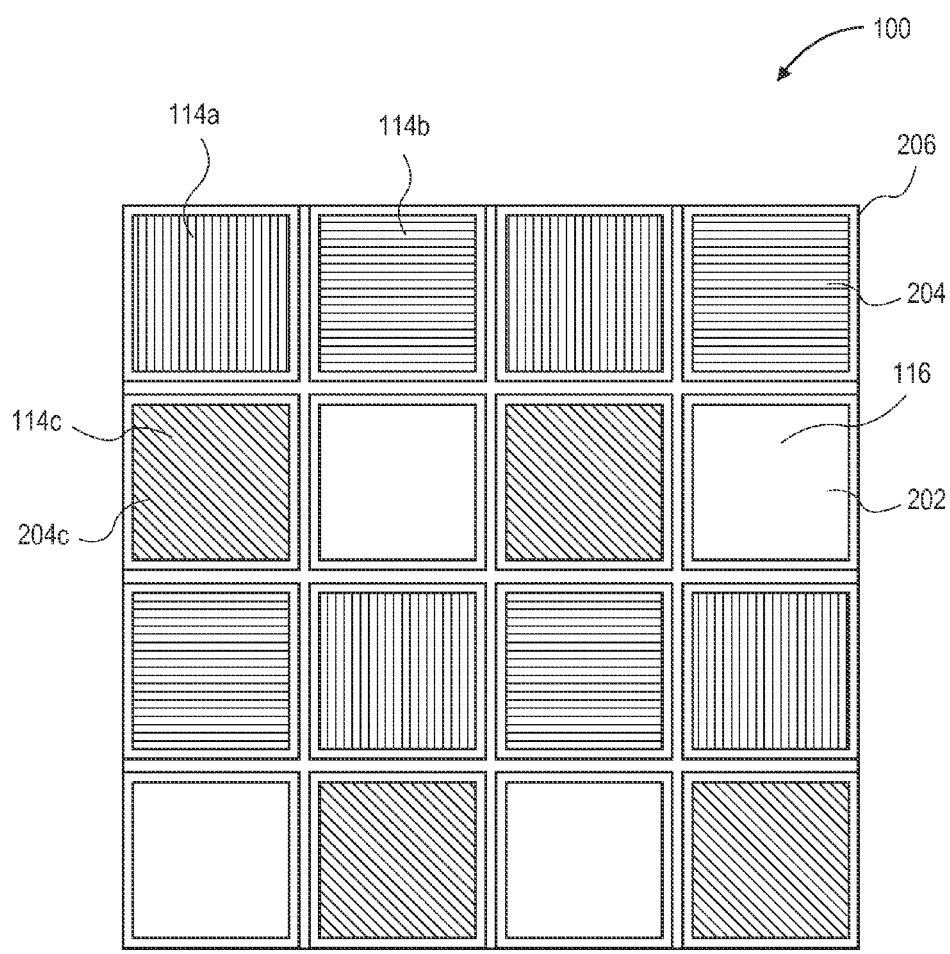

FIG. 2A is a diagrammatic top plan view illustrating an implementation of the light sensor depicted in FIG. 1A.

Figure 2B:
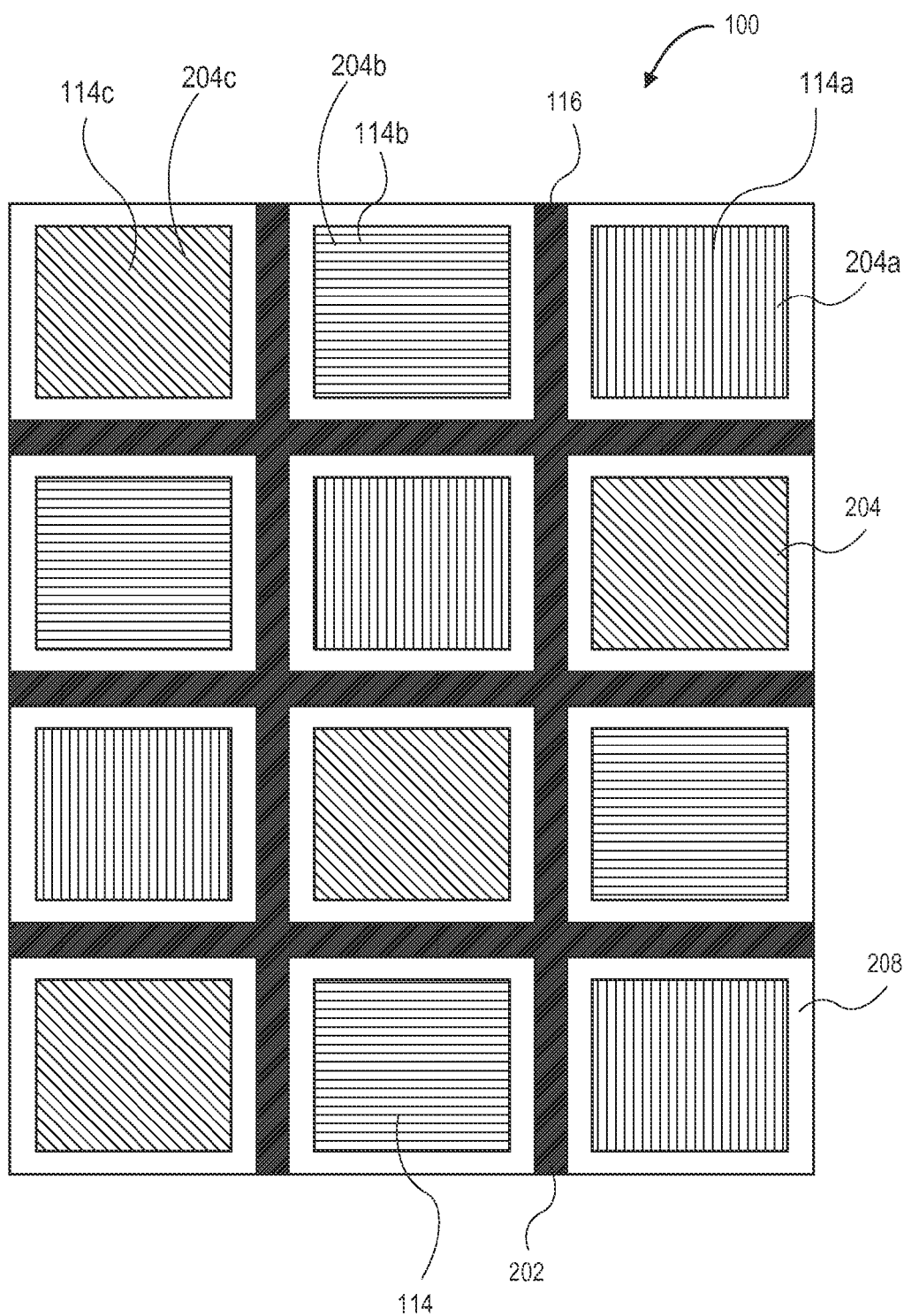

FIG. 2B is a diagrammatic top plan view illustrating a second implementation of the light sensor depicted in FIG. 1B, illustrating the placement of clear photodetectors in areas of the substrate between the color interference filters.

Figure 2C:
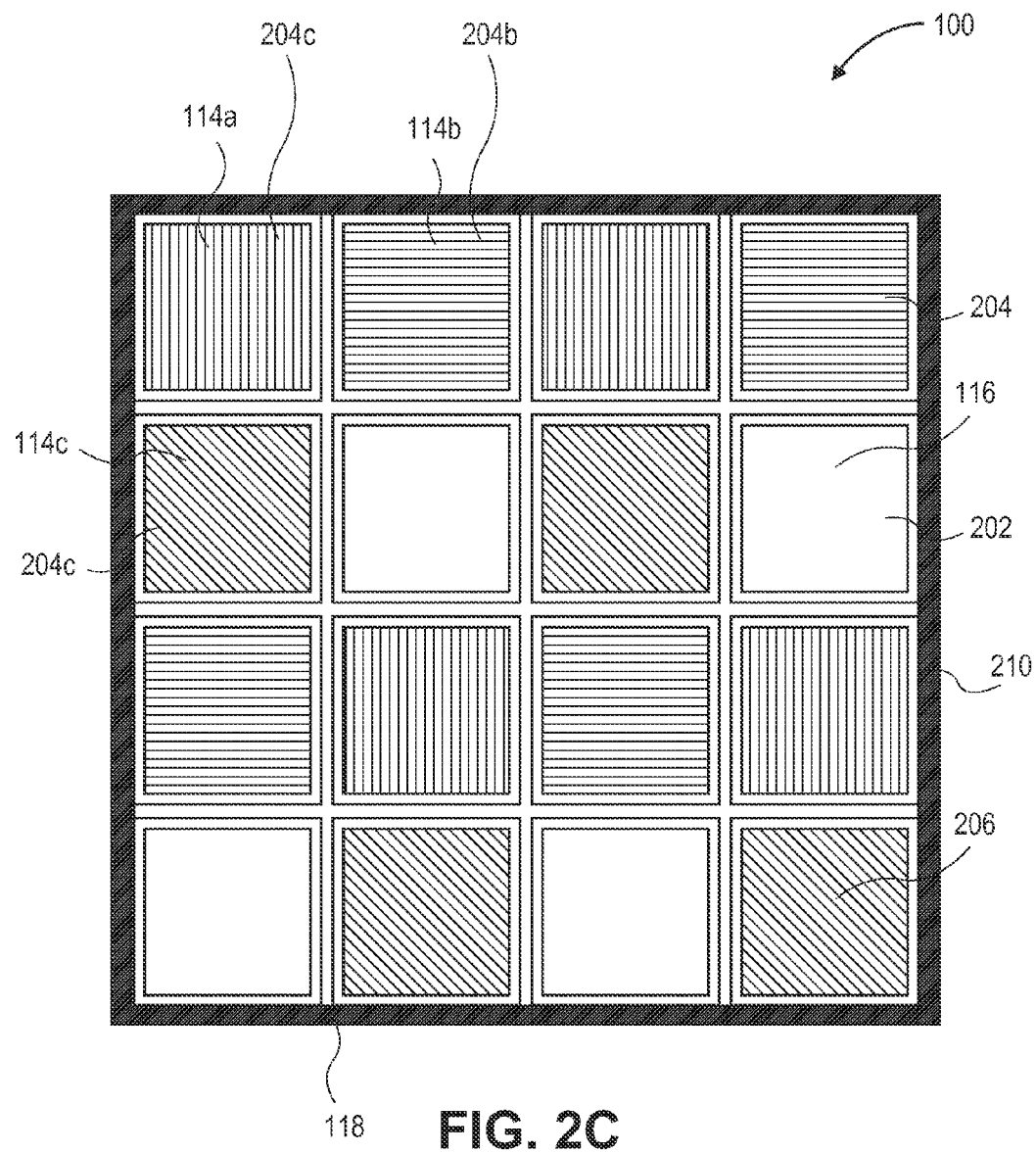

FIG. 2C is a diagrammatic plan view illustrating the application of a dark mirror to the light sensor shown in FIG. 2A.

Figure 2D:
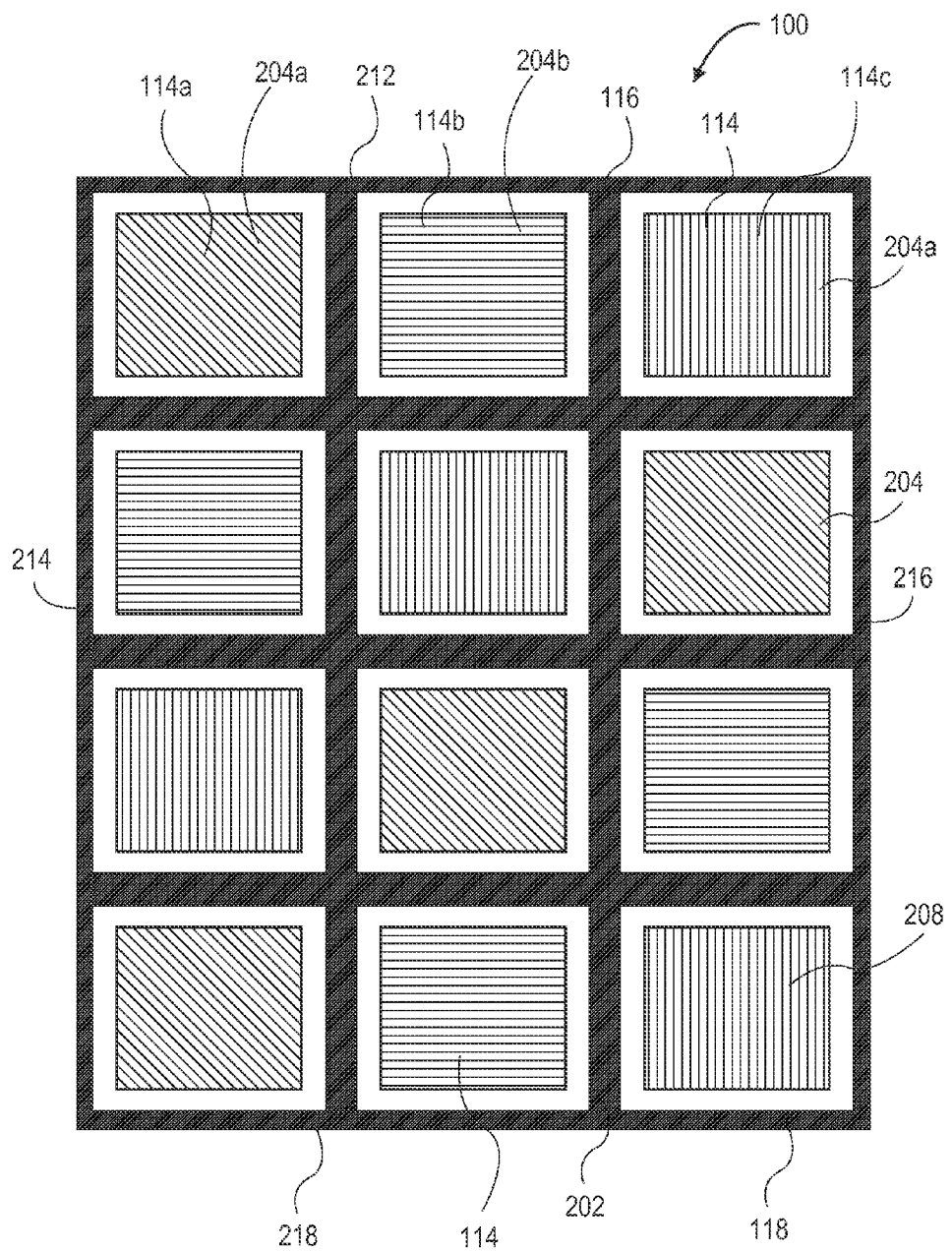

FIG. 2D is a diagrammatic plan view illustrating the application of a dark mirror to the light sensor shown in FIG. 2B.

Figure 3:
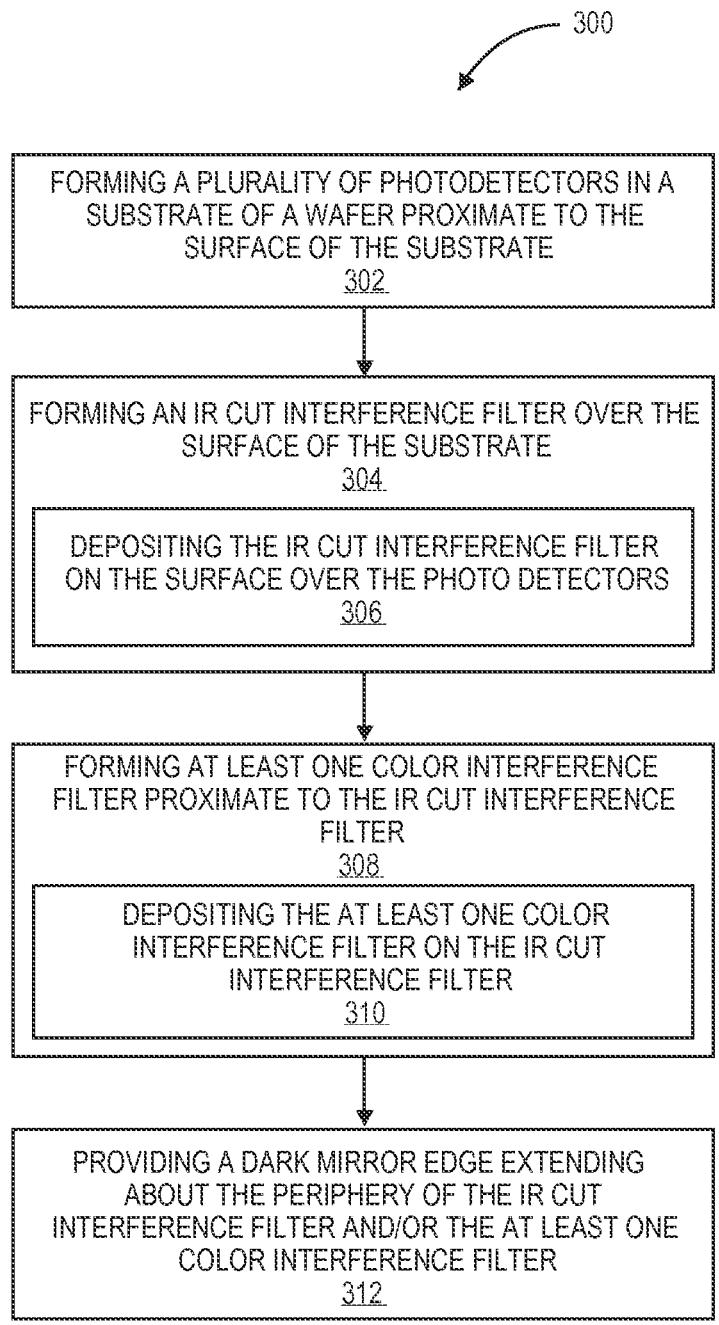

FIG. 3 is a flow diagram illustrating a process in an example implementation for fabricating a light sensor in accordance with the present disclosure.

DETAILED DESCRIPTION

Overview

To filter infrared light, light sensors may employ infrared blocking filters to reduce the transmission of infrared light, while passing visible light to the photodetector array of the light sensor. Such IR blocking filters are comprised of IR cut material applied externally to the light sensor package following fabrication of the package. This configuration effectively blocks infrared light from reaching the photodiodes, but also substantially reduces the amount of infrared light that reaches the infrared photodetectors of the light sensor. Consequently, the sensitivity of the resulting light sensor to infrared light is reduced.

Accordingly, a light sensor is described that includes an IR cut and at least one color interference filter integrated on-chip (i.e., integrated on the die of the light sensor). In this manner, the IR cut interference filter may be patterned so that it does not block infrared light to infrared photodetectors of the light sensor. In one or more implementations, the light sensor is fabricated as a semiconductor device that comprises a die having a substrate. Photodetectors such as photodiodes, phototransistors, or the like, are formed in the substrate proximate to the surface of the substrate. The IR cut interference filter is disposed on the surface of the substrate over the photodetectors. The IR cut interference filter is configured to filter infrared light from light received by the light sensor to at least substantially block infrared light from reaching the photodetectors. However, by forming the IR cut interference filter on the substrate, the IR cut interference filter may be patterned so that it does not block infrared light to infrared photodetectors of the light sensor. One or more color interference filters are disposed proximate to the IR cut interference filter. For example, color interference filters (e.g., red, green, blue filters) may be formed on the IR cut interference filter or on the surface of the substrate under the IR cut interference filter. The color interference filters are configured to filter visible light received by the light sensor to pass light in a limited spectrum of wavelengths (e.g., light having wavelengths between a first wavelength and a second wavelength) to at least one of the photodetectors. The photodetectors may also comprise one or more clear photodetectors configured to receive light that is not filtered by a color interference filter, thereby allowing the clear photodetector to detect the ambient light environment. In implementations, the clear photodetectors may be positioned between color interference filters to reduce the silicon implementation area of the light sensor. In at least one implementation, a dark mirror may be formed about the periphery of the IR cut interference filter. The dark mirror is configured to at least substantially eliminate impingement of light onto the photodetectors that does not pass through the IR cut interference filter.

In the following discussion, example implementations of light sensors that include an IR cut interference filter and at least one color interference filter integrated on-chip are first described. Example procedures are then discussed that may be employed to fabricate the example light sensor.

Example Implementations

FIGS. 1A through 1F, illustrate light sensors 100 in accordance with an example implementation of the present disclosure. As shown, the light sensors 100 comprise semiconductor devices that include a die having a substrate 102. The substrate 102 furnishes a base material utilized to form one or more electronic devices through various fabrication techniques such as photolithography, ion implantation, deposition, etching, and so forth. The substrate 102 may comprise n-type silicon (e.g., silicon doped with a group V element (e.g., phosphorus, arsenic, antimony, etc.) to furnish n-type charge carrier elements to the silicon) or p-type silicon (e.g., silicon doped with a group IIIA element (e.g., boron, etc.) to furnish p-type charge carrier elements to the silicon).

The substrate 102 of each light sensor 100 is illustrated as having a top surface 104 and a bottom surface 106. An array of photodetectors (photodetectors 108, 112 are shown) is formed in the substrate 102 proximate to the top surface 104. The photodetectors 108, 112 within the array may be configured in a variety of ways. For example, the photodetectors 108, 112 may be comprised of a photo sensor diode, a phototransistor, or the like. In an implementation, the photodetectors 108, 112 are capable of detecting a light and providing a signal in response thereto. The photodetectors 108, 112 may provide a signal by converting light into current or voltage based upon the intensity of the detected light. Thus, once a photodetector is exposed to light, multiple free electrons may be generated to create a current. The photodetectors 108, 112 are configured to detect light in both the visible light spectrum and the infrared light spectrum. As used herein, the term light is contemplated to encompass electromagnetic radiation occurring in the visible light spectrum and the infrared light spectrum. The visible light spectrum (visible light) includes electromagnetic radiation occurring in the range of wavelengths from approximately three hundred and ninety (390) nanometers to approximately seven hundred and fifty (750) nanometers. Similarly, the infrared light spectrum (infrared light) includes electromagnetic radiation that ranges in wavelength from approximately seven hundred (700) nanometers to approximately three hundred thousand (300,000) nanometers. In implementations, complimentary metal-oxide-semiconductor (CMOS) fabrication techniques may be utilized to form the photodetectors 108, 112.

An IR cut interference filter 110 is illustrated as formed over the photodetectors 108 on the top surface 104 of the substrate 102. The IR cut interference filter 110 is configured to filter infrared light from light received by the light sensor 100 to at least substantially block infrared light from reaching the photodetectors 108. The IR cut interference filter 110 may further be configured to at least substantially pass visible light (i.e., light in the visible spectrum) received by the light sensor 100 to the photodetectors 108. For instance, in an example implementation, an IR cut interference filter 110 may be provided that is capable of blocking approximately fifty (50) to one hundred (100) percent of infrared light (e.g., light in the infrared spectrum) incident on the photodetectors 108 while at least substantially passing (e.g., passing greater than approximately fifty (50) percent) visible light (e.g., light in the visible spectrum) to the photodetectors 108. However, the aforementioned values (e.g., percentage values representing the proportion of infrared light blocked and/or passed by the IR cut interference filter 110) may depend on particular application requirements of the light sensor 100. Moreover, IR cut interference filters 110 that are capable of blocking a higher or lower proportion of infrared light and/or of transmitting a higher or lower proportion of visible light are contemplated.

The IR cut interference filter 110 may be configured in a variety of ways. In an implementation, the IR cut interference filter 110 may comprise a multi-layer structure that includes at least two different materials of different refractive indices. The IR cut interference filter 110 may be approximately five (5) to fifteen (15) microns thick and/or approximately seventy (70) to one hundred twenty (120) layers thick. In a specific implementation, the IR cut interference filter 110 may be approximately ten (10) microns thick and/or approximately ninety (90) to one hundred (100) layers thick. However, it is contemplated that the IR cut interference filter 110 may have other constructions (e.g., number of layers) and/or thicknesses. Moreover, although a single IR cut interference filter 110 is illustrated, it is contemplated that the light sensor 100 may be provided with multiple IR cut interference filters 110.

In at least some implementations, the light sensor 100 may be configured to include one or more infrared photodetectors 112 (i.e., photodetectors 108 that are configured to detect light in the infrared spectrum formed in the substrate 102 of the light sensor 100 die). These photodetectors 112 detect infrared light (i.e., light in the infrared spectrum) that may, for example, be transmitted by an infrared transmitter (e.g., an infrared light emitting diode (LED)) as part of a proximity sensor implemented in the electronic device. Accordingly, the IR cut interference filter 110 may be patterned so that it does not block the reception of infrared light (i.e., light in the infrared spectrum) by the infrared photodetectors 112, thereby increasing the sensitivity of the light sensor to infrared light and improving the performance of devices that employ the light sensor 100 (e.g., the proximity sensor in an electronic device).

Color interference filters 114 are illustrated proximate to the IR cut interference filter 110. The color interference filters 114 are configured to filter visible light received by the light sensor 100 to pass light in a limited spectrum of wavelengths (e.g., light having wavelengths between a first wavelength and a second wavelength) to at least one of the photodetectors 108. In one implementation, the color interference filters 114 allow visible light in a limited spectrum of wavelengths to pass through the filter, while blocking (e.g., reflecting) visible light within a second spectrum of wavelengths. Thus, the color interference filters 114 may be substantially transparent for visible light within a first spectrum of wavelengths, and substantially opaque within a second spectrum of wavelengths. In implementations, the color interference filters 114 may comprise multilayer structures having varied thicknesses and/or numbers of layers, which may have differing thicknesses and/or refractive indices.

A plurality of color interference filters 114 may be employed. For example, the light sensor 100 may comprise a first color interference filter 114a configured to filter visible light and pass light having a first limited spectrum of wavelengths (e.g., wavelengths between a first wavelength and a second wavelength), a second color interference filter 114b configured to filter visible light and pass light having a second limited spectrum of wavelengths (e.g., wavelengths between a third wavelength and a fourth wavelength), and a third color interference filter 114c configured to filter visible light and pass light having a third spectrum of wavelengths (e.g., wavelengths between a fifth wavelength and a sixth wavelength), and so forth. In the example illustrated, the light sensor 100 is comprised of an array of three different color interference filters 114: a first (blue) color interference filter 114a configured to transmit a "blue" visible light (i.e., visible light with a wavelength between approximately four hundred fifty (450) nanometers and approximately four hundred seventy-five (475) nanometers); a second (green) color interference filter 114b configured to transmit a "green" visible light (i.e., visible light with a wavelength between approximately four hundred ninety-five (495) nanometers and approximately five hundred and seventy (570) nanometers); and a third (red) color interference filter 114c configured to transmit a "red" visible light (i.e., visible light with a wavelength between approximately six hundred and twenty (620) nanometers and approximately seven hundred and fifty (750) nanometers). It is contemplated that other visible light color interference filters 114 may be employed. For instance, color interference filters 114 configured to transmit visible light having limited spectrums of wavelengths typically associated with the colors of cyan, magenta, yellow, and so forth, may be provided. The color interference filters 114 are selectively arrayed over photodetectors 108 to allow visible light in a desired limited spectrum of wavelengths to be passed to the photodetectors 108. For example, as shown in FIGS. 1A and 1B, the first color interference filter 114a is positioned over a first photodetector 108a, the second color interference filter 114b is positioned over a second photodetector 108b, and the third filter 112c is positioned over a third photodetector 108c.

In the implementations illustrated in FIGS. 1A and 1B, the color interference filters 114 are formed on the outer surface of the IR cut interference filter 110. However, it is contemplated that, in other implementations, the color interference filters 114 may be formed on the surface 104 of the substrate 102 directly over one or more corresponding photodetectors 108. The IR cut interference filter 110 is thus formed on the surface 104 of the substrate 102 over the color interference filters 108, and would at least substantially cover the color interference filters 114 upon completion of the fabrication process. In an example implementation, the color interference filters 114 have a thickness of approximately five (5) microns. However, it is contemplated that color interference filters 114 having lesser or greater thicknesses are possible.

The array of photodetectors 108 may further include one or more clear photodetectors 116 configured to receive light that is not filtered by a color interference filter 114. As illustrated, the clear photodetectors 116 may be positioned in the substrate 102 so that they are positioned under the IR cut interference filter 110 but are not located below a color interference filter 114. Thus, the clear photodetectors 116 detect light within a spectrum of wavelengths corresponding to several visible colors (i.e., light from the visible spectrum). In this manner, the clear photodetectors 116 may be used to detect visible ambient lighting conditions absent infrared interference.

The clear photodetectors 116 may be configured in a variety of ways. For example, like the other photodetectors 112 within the array, the clear photodetectors 114 may comprise a photodiode, a phototransistor, or the like, that is capable of detecting a light by converting light into current or voltage. In an implementation, the signal (e.g., current or voltage) produced by the clear photodetectors 116 is based upon (e.g., proportional to) the detected intensity of visible light received. Thus, the clear photodetectors 116 may be used to detect the intensity of the ambient light level outside of a portable electronic device (not shown) in which the light sensor 100 is integrated. The resulting measure of ambient light intensity may be utilized by various applications running in the portable electronic device. For example, an application of the portable electronic device may control the brightness of a display screen based upon the ambient light intensity.

As discussed above, the clear photodetectors 116 may be arrayed with the photodetectors 108 which receive light that passes through a color interference filter 114. In the implementation illustrated in FIGS. 2A and 2C, the clear photodetectors 116 are shown positioned in one or more cells (clear sensor cells 202) that are arrayed with cells (color sensor cells 204) containing photodetectors 108 which receive light that passes through a color interference filter 114. Thus, in the implementation illustrated, the light sensor 100 may include an array 206 of cells 202, 204 having one or more clear sensor cells 202 that do not include a color interference filter 114, one or more first color sensor cells 204a that comprise a first color interference filter 114a (e.g., a blue color interference filter), one or more second color sensor cells 204b that comprise a second color interference filter 114b (e.g., a green color interference filter), one or more third cells that comprise a third color interference filter 114c (e.g., a red color interference filter), and so forth. As noted above, it is contemplated that a wide variety of visible light color interference filters 114 may be employed by the light sensor 100. Thus, color sensor cells 204 may comprise color interference filters 114 configured to transmit light having colors of cyan, magenta, yellow, and so forth.

Spacing exists between the color interference filters 114 due to the requirements of fabrication processes (e.g., lithography) used in their formation. For instance, in an example array 206, between approximately twenty (20) to approximately forty (40) microns of "empty" space (channels) may be left between each color interference filter 114 (e.g., between each color cell 204) and other color interference filters 114 (e.g., other color cells 204), or other circuit elements of the light sensor 100. In the implementation shown in FIGS. 1B through 1F, 2B, and 2D, the clear photodetectors 114 are positioned to utilize this empty space. For example, in the example implementation shown in FIGS. 1B through 1F, a clear photodetector 116 may be positioned between the first photodetector 108a and the second photodetector 108b. Similarly, a second clear photodetector 116 may be positioned between the second photodetector 108b and the third photodetector 108c. The clear photodetectors 116 are covered by the IR cut interference filter 110.

The clear photodetectors 116 may thus be positioned in the "empty" channels 206 between color cells 204 (i.e., cells comprising color interference filters 114) as shown in FIGS. 2B and 2D. The clear photodetectors 116 may also be positioned proximate to the outside edges of array 208. Thus, an array 208 is formed wherein the clear sensor cell 202 (e.g., clear photodetectors 116) is interlaced between multiple color sensor cells 204 (i.e., between the color interference filters 114). This array 208 provides greater utilization of the surface area of the substrate 202. For instance, in one example, area utilization by an implementation employing the array 208 shown in FIG. 2B and 2D was ten percent (10%) greater than that of an implementation configured with the array 206 shown in FIG. 2A and 2C.

In FIGS. 1C through 1F and FIGS. 2C through 2D, light sensors 100 are illustrated that further include a dark mirror 118 configured to substantially eliminate impingement of light on the photodetectors 108 that does not pass through the IR cut interference filter 110. The dark mirror 118 may be constructed from opaque dielectric materials in such a way that does not transmit and reflects light (visible light and infrared light). As shown, the dark mirror 118 is positioned about the periphery of the IR cut interference filter 110 (e.g., proximate to edges 212, 214, 216, 218 of the array 208). However, in other implementations, the dark mirror 118 can also cover the edge of the color interference filters 114.

In various implementations, the light sensors 100 described herein may be configured to detect a surrounding light environment and/or to provide infrared light detection (e.g., for use as a proximity sensor). The color interference filters 114 are configured to filter visible light and pass light in a limited spectrum of wavelengths to the respective photodetectors 108. The photodetectors 108 generate a signal (e.g., current value) based upon the intensity of the light. The IR cut interference filter 110 is configured to filter infrared light to substantially block infrared light from reaching the photodetectors 108. The clear photodetectors 114 detect ambient lighting conditions absent color filtration and generate a signal (e.g., a current value) based upon the intensity of visible light detected. The signal generated by the photodetectors 108 that receive filtered light and the clear photodetectors 114 may be utilized by other circuit devices and/or applications to control various aspects of a portable electronic device (e.g., control the brightness of the device's display screen, to turn off backlighting to conserving battery life, and so forth). Infrared photodetectors 114 may detect infrared light (i.e., light in the infrared spectrum) that may, for example, be transmitted by an infrared transmitter (e.g., an infrared light emitting diode (LED)) as part of a proximity sensor implemented in the electronic device. The IR cut interference filter 110 may be patterned so that it does not block the reception of infrared light by the infrared photodetectors 114, thereby increasing the sensitivity of the light sensor to infrared light and improving the performance of devices that employ the light sensor 100.

Example Fabrication Process

The following discussion describes example techniques for fabricating a light sensor that includes an IR cut interference filter and at least one color interference filter integrated on-chip (i.e., integrated on the die of the light sensor). In the implementation described below, the light sensor is fabricated utilizing back-end complementary metal-oxide-semiconductor (CMOS) processing techniques. However, it is contemplated that light sensors in accordance with the present disclosure may be fabricated using other semiconductor chip fabrication/packaging technologies, such as wafer-level packaging (WLP), and so on.

FIG. 3 depicts a process 300, in an example implementation, for fabricating a light sensor, such as the example light sensors 100 illustrated in FIGS. 1A through 2D and described above. In the process 300 illustrated, a plurality of photodetectors are formed in a substrate of a wafer proximate to the surface of the substrate (Block 302). The substrate of the wafer may comprise n-type silicon (e.g., silicon doped with a group V element (e.g., phosphorus, arsenic, antimony, etc.) to furnish n-type charge carrier elements to the silicon) or p-type silicon (e.g., silicon doped with a group IIIA element (e.g., boron, etc.) to furnish p-type charge carrier elements to the silicon). Thus, the substrate furnishes a base material utilized to form the photodetectors as well as other electronic devices of the light sensor. The photodetectors may comprise photodiodes, phototransistors, or the like, formed in the substrate of the wafer using suitable fabrication techniques such as photolithography, ion implantation, deposition, etching, and so forth. In one or more implementations, at least one photodetector of the plurality of photodetectors may comprise an infrared photodetector that is configured to detect an infrared light (light in the infrared spectrum).

An IR cut interference filter is next formed over the surface of the substrate 102 (Block 304). In one or more implementations, the IR cut interference filter may be deposited on the surface of the substrate over the photodetectors (Block 306) using a suitable deposition technique. The IR cut interference filter may further be patterned so that it does not block the reception of infrared light (i.e., light in the infrared spectrum) by infrared photodetectors formed in the substrate, as described in the discussion of Block 302. For instance, in an example implementation, the IR cut interference filter may comprise a multi-layer structure that includes two different materials that each has a different refractive index to create an interference effect to block infrared light. In such implementations, the various layers of the IR cut interference filter may be formed on a wafer using sputtering deposition techniques and patterned using resist lift-off techniques. However, it is contemplated that other techniques may also be employed. These techniques may include, but are not limited to: magnetron sputtering, chemical vapor deposition (CVD), electrochemical deposition (ECD), molecular beam epitaxy (MBE), and atomic layer deposition (ALD). When formed, the IR cut interference filter may be approximately five (5) to fifteen (15) micros thick and/or approximately seventy (70) to one hundred and twenty (120) layers thick. However, it is contemplated that the IR cut interference filter may have other constructions and/or thicknesses.

One or more color interference filters 112 are formed proximate to the IR cut interference filter (Block 308). In an implementation, the color interference filters are deposited on the outer surface of the IR cut interference filter using suitable deposition techniques (Block 310). However, it is contemplated that, in other implementations, the color interference filters may be formed on the surface of the substrate directly over one or more corresponding photodetectors prior to formation of the IR cut interference filter. The IR cut interference filter may then be formed on the surface of the substrate over the color interference filters, so that the IR cut interference filter at least substantially covers the color interference filters. The color interference filters may be aligned with a respective photodetector to filter light received by that photodetector. When formed, the color interference filters may have a thickness of approximately five (5) microns. However, it is contemplated that color interference filters having lesser or greater thicknesses are possible. The color interference filters may be fabricated using methodology and/or techniques that are the same as, or similar to, those used to form the IR cut interference filter.

In one or more implementations, a dark mirror may be provided about the periphery of the IR cut interference filter and/or the periphery of the color interference filters (Block 118) to substantially eliminate impingement of light on the photodetectors that does not pass through the IR cut interference filter (and/or the color interference filters). The dark mirror is formed of opaque materials (e.g., metal/oxide multilayer, or the like) that do not transmit light (visible light and infrared light). The dark mirror may be formed using a variety of techniques, such as via the deposition/patterning techniques, and so forth. For example, sputtering and photo-resist lift-off techniques may be utilized to form the dark mirror.

As noted, the light sensor may be fabricated utilizing back-end complementary metal-oxide-semiconductor (CMOS) processing techniques. Thus, the photodetectors, the color interference filters, and the IR cut interference filter may be formed at wafer level. The wafer is thereafter diced into one or more dies, and each die packaged individually to form a light sensor. The wafer may also be further processed following formation of the photodetectors, color interference filters, and IR cut interference filter using wafer-level packaging (WLP) techniques and diced to form one or more light sensors.

Conclusion

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A light sensor comprising:
    a substrate having a surface;
    a plurality of photodetectors disposed proximate to the surface, each of the plurality of photodetectors configured to detect light and to provide a signal in response thereto;
    an IR cut interference filter disposed over the surface and configured to filter infrared light to at least substantially block infrared light from reaching the plurality of photodetectors;
    at least one color interference filter disposed proximate to the IR cut interference filter, the at least one color interference filter configured to filter visible light to pass light in a limited spectrum of wavelengths to at least one photodetector of the plurality of photodetectors; and
    a dark mirror disposed about a periphery of the IR cut interference filter, the dark mirror configured to at least substantially eliminate impingement of light that does not pass through the IR cut interference filter onto the plurality of photodetectors.

2. The light sensor as recited in claim 1, wherein at least one of the plurality of photodetectors comprises a clear photodetector, the clear photodetector configured to receive light unfiltered by a color interference filter to detect an ambient light environment.

3. The light sensor as recited in claim 1, wherein the IR cut interference filter is deposited on the surface of the substrate over the plurality of photodetectors and the at least one color interference filter is deposited on the IR cut interference filter.

4. The light sensor as recited in claim 1, wherein the at least one color interference filter is deposited on the surface of the substrate and the IR cut interference filter is deposited on the surface of the substrate over the photodetectors and the at least one color interference filter.

5. The light sensor as recited in claim 1, wherein the photodetectors comprise at least one of photodiodes or phototransistors.

6. The light sensor as recited in claim 1, further comprising the dark mirror disposed about a periphery of the at least one color interference filter, the dark mirror configured to at least substantially eliminate impingement of light that does not pass through the IR cut interference filter onto the plurality of photodetectors.

7. A light sensor comprising:
    a substrate having a surface;
    a plurality of photodetectors disposed proximate to the surface, the plurality of photodetectors configured to detect light;
    an infrared photodetector disposed proximate to the surface, the infrared photodetector configured to detect infrared light;
    an IR interference filter disposed over the surface and configured to at least substantially block transmission of infrared light to the plurality of photodetectors;
    a first color interference filter disposed proximate to the IR interference filter and configured to filter visible light to pass visible light in a first limited spectrum of wavelengths to at least a first one of the plurality of photodiodes;
    a second color interference filter disposed proximate to the IR interference filter and configured to filter visible light to pass visible light in a second limited spectrum of wavelengths to at least a second one of the plurality of photodiodes; and
    a third color interference filter disposed proximate to the IR interference filter and configured to filter visible light to pass visible light in a third limited spectrum of wavelengths to at least a third one of the plurality of photodiodes.

8. The light sensor as recited in claim 7, wherein the plurality of photodetectors comprises at least one clear photodetector, the clear photodetector configured to detect visual light that is not filtered by the first color interference filter, the second color interference filter, or the third color interference filter.

9. The light sensor as recited in claim 8, wherein the at least one clear photodetector is positioned between the first color interference filter and the second color interference filter or between the second color interference filter and the third color interference filter.

10. The light sensor as recited in claim 7, wherein the IR interference filter is patterned so that the IR interference filter does not filter light received by the infrared photodetector.

11. The light sensor as recited in claim 7, wherein the first limited spectrum of wavelengths comprises wavelengths from approximately 450 nm to approximately 475 nm, the second limited spectrum of wavelengths comprises wavelengths from approximately 495 nm to approximately 570 nm, and the third limited spectrum of wavelengths comprises wavelengths from approximately 620 nm to approximately 750 nm.

12. The light sensor as recited in claim 7, further comprising a dark mirror disposed about a periphery of the IR interference filter, the dark mirror configured to at least substantially eliminate impingement of light that does not pass through the IR interference filter onto the plurality of photodetectors.

13. The light sensor as recited in claim 12, further comprising the dark mirror formed about a periphery of the first color interference filter, a periphery of the second color interference filter, and a periphery of the third color interference filter, the dark mirror configured to at least substantially eliminate impingement of light that does not pass through the IR interference filter onto the plurality of photodetectors.

14. A process comprising:
  providing a plurality of photodetectors proximate to a substrate, each of the plurality of photodetectors configured to detect light and to provide a signal in response thereto;
  depositing the IR cut interference filter on the surface of the substrate over the photodetectors, the IR cut interference filter configured to filter infrared light to at least substantially block infrared light from reaching the plurality of photodetectors;
  and
  depositing the at least one color interference filter on the IR cut interference filter, the at least one color interference filter configured to filter visible light to pass light in a limited spectrum of wavelengths to at least one photodetector of the plurality of photodetectors.

15. The process as recited in claim 14, wherein providing of the at least one color interference filter proximate to the IR cut interference filter comprises depositing the at least one color interference filter on the surface of the substrate, and wherein providing of the IR cut interference filter comprises depositing the IR cut interference filter on the surface of the substrate over the photodetectors and the at least one color interference filter.

16. The process as recited in claim 15, further comprising patterning the IR cut interference filter.

17. The process as recited in claim 14, further comprising providing a dark mirror about a periphery of the IR interference filter, the dark mirror configured to at least substantially eliminate impingement of light that does not pass through the IR interference filter onto the plurality of photodetectors.

* * * * *